United States Patent [19]

Ford

[11] Patent Number: 5,418,182
[45] Date of Patent: May 23, 1995

[54] METHOD OF FABRICATING DIODE LASERS USING ION BEAM DEPOSITION

[75] Inventor: Carol M. Ford, Columbia Heights, Minn.

[73] Assignee: Honeywell Inc., Minneapolis, Minn.

[21] Appl. No.: 37,959

[22] Filed: Mar. 26, 1993

[51] Int. Cl.6 .......................................... H01L 21/20
[52] U.S. Cl. ..................... 437/129; 117/92; 148/DIG. 95; 204/192.11; 372/46; 427/162; 437/20
[58] Field of Search ............... 156/613, 614, DIG. 63, 156/DIG. 64, DIG. 73, DIG. 80; 437/129, 20; 372/46, 72; 327/96; 117/92; 148/DIG. 95; 204/192.11, 192.26; 427/162

[56] References Cited

U.S. PATENT DOCUMENTS

| | | | |
|---|---|---|---|
| 4,045,749 | 8/1977 | Burnham et al. | 331/94.5 H |
| 4,073,675 | 2/1978 | Ballman et al. | 427/162 |
| 4,664,769 | 5/1987 | Cuomo et al. | 204/192.11 |
| 4,784,722 | 11/1988 | Liau et al. | 156/649 |
| 4,990,465 | 2/1991 | Liau et al. | 437/129 |
| 5,062,117 | 10/1991 | Anthon et al. | 372/75 |
| 5,070,505 | 12/1991 | Dixon | 372/22 |
| 5,070,507 | 12/1991 | Anthon | 372/41 |
| 5,119,388 | 6/1992 | Feit et al. | 372/46 |
| 5,240,583 | 8/1993 | Ahonen | 204/298.04 |
| 5,274,660 | 12/1993 | Abe | 372/96 |
| 5,308,461 | 5/1994 | Ahonen | 204/192.11 |

*Primary Examiner*—R. Bruce Breneman
*Assistant Examiner*—Felisa Garrett

[57] ABSTRACT

A process for fabricating a diode laser is disclosed which allows the laser to be easily aligned with other components. Furthermore, the disclosed method provides a means for fabricating an entire diode laser upon a single substrate, thus eliminating the complexity of positioning and alignment. Ion beam deposition is used to create many of the components, thus forming very efficient and very uniform components.

19 Claims, 2 Drawing Sheets

1

METHOD OF FABRICATING DIODE LASERS USING ION BEAM DEPOSITION

FIELD OF THE INVENTION

The present invention involves diode lasers and, more specifically, the method by which a diode laser is fabricated. Furthermore, the invention describes an advantageous method of diode laser fabrication.

BACKGROUND OF THE INVENTION

Diode lasers, or diode pumped lasers, are generally devices having some kind of light source, an optically pumped lasant material, reflecting means to form a resonant cavity, and associated peripherals used to focus and direct light signals. The light source is generally a light emitting diode or LED which provides a first optical signal. The first optical signal is directed towards the lasant material. Situated on either side of the lasant material are reflective coatings, or mirrors, which are used to contain an oscillating optical signal. One of the reflective coatings is only partially reflective, however, thus allowing a second optical signal to be transmitted through the partially reflective surface. The second optical signal can then be transmitted to a waveguide, optical fiber or focusing means, depending on the desired application of the laser.

As is well known in the art, the light source provides a first optical signal to the lasant material creating a population inversion in the lasant material, thus resulting in the emission light. As previously mentioned, reflective coatings, or mirrors, are situated on either side of the lasant material, thus creating a resonant cavity. Due to the pumping from the light source, the emitted light resonates within the lasant material. One of the reflective coatings on one end of the lasant material is only partially reflective, thus allowing a portion of the resonant optical signal to be transmitted from the lasant material.

Optical alignment of the necessary elements is very critical in a diode laser in order to achieve efficient optical pumping and proper output alignment. One method of achieving the required alignment is through the use of a precise holder which appropriately positions all of the necessary elements. Although a holder provides many advantages, the necessary positioning and alignment is still a very time consuming and tedious task. Furthermore, the fabrication of the holder is complicated due to the tight specifications which must be met.

A number of different materials are available for use as the lasant material. Typically, a single crystalline structure is used which contains a dopant. The only requirement of the lasant material is the ability to produce the required population inversion. Example materials for use in creating the necessary population inversion include many of the rare earth materials such is erbium (Er) and neodymium (Nd). The aforementioned lasant material is typically fabricated using a number of different methods. Examples of these methods include chemical vapor deposition and molecular beam epitaxy, to create appropriate lasant structures. Many of these structures comprise a host material doped with a rare earth material. These methods have produced adequate lasant material; however, the population inversion is much more efficient if the rare earth material is very evenly and uniformly distributed throughout the host material. Such even distribution is difficult and sometimes impossible using the aforementioned methods.

Furthermore, many of the previously used methods of fabrication involve "hot processing". "Hot processing" requires that the substrates be heated to a very high temperature. While this process is efficient at depositing materials, it is also very destructive to any structures that already exist on the surface upon which the necessary material is to be deposited.

SUMMARY OF THE INVENTION

It is an object of the present invention to provide a method to fabricate a diode laser wherein the lasant material provides efficient emission of light. The method used allows for the creation of a lasant material having the necessary rare earth materials very evenly doped therein, thus improving efficiency of operation. Furthermore, the amount of doping is easily controlled.

It is a further object of the present invention to derive a process for fabricating a diode laser which can be used in conjunction with the production of other optical elements, thus allowing ease of alignment and positioning. This process allows the diode laser to be more easily integrated into other products.

The diode laser of the present invention comprises a light source and lasant material, both of which are attached to a single substrate. The light source, or pump diode, may be attached to the substrate by either growing the necessary structure on the substrate or attaching a discrete component upon the surface of the substrate. The lasant material is then deposited onto the substrate using the process of ion beam deposition. Ion beam deposition is a cold process which allows for even deposition of the lasant material without destroying existing structures. Therefore, by using ion beam deposition to create a lasant material, a previously existing diode would not be destroyed.

Ion beam deposition is well known in the art for depositing thin films of material. As previously mentioned, the lasant material may be a host material which is doped with a rare earth material. By using ion beam deposition to deposit the lasant material, doping of a host material, thus creating the lasant material, is easily controlled. Furthermore, the doping of the host material is very uniform throughout the entire structure.

Lastly, the use of ion beam deposition to deposit the lasant material allows ease of positioning and alignment relative to other components which may exist on the substrate. Alternatively, other components could be subsequently deposited upon the same substrate. One example of other components which may need to be aligned with the lasant material are waveguides which are deposited onto the same substrate. In this example, the waveguides could also be fabricated using ion beam deposition.

BRIEF DESCRIPTION OF THE DRAWINGS

Further objectives and advantages can be seen by reading the following detailed description in conjunction with the drawings in which.

DESCRIPTION OF THE PREFERRED EMBODIMENT

Figure 1:
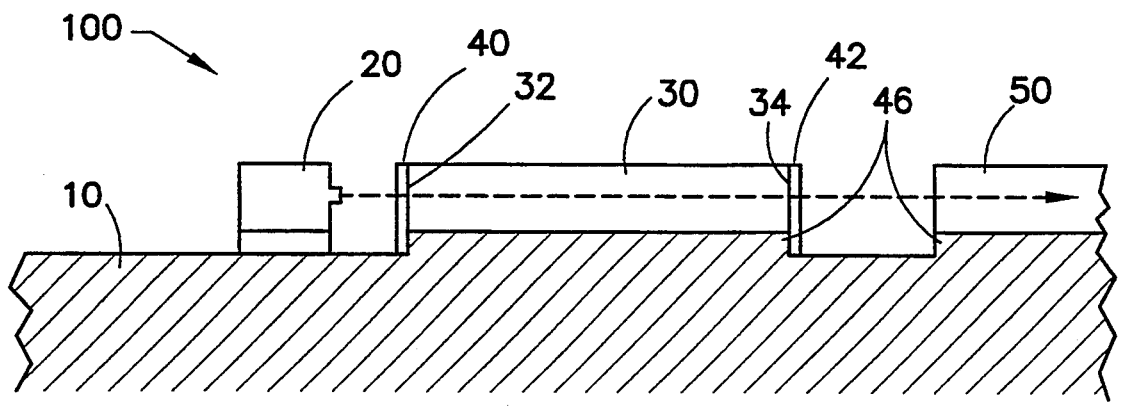
FIG. 1 is a side view of one embodiment a diode laser fabricated using the method of the present invention.

Referring now to FIG. 1, there is illustrated one embodiment of a diode laser 100 which is fabricated using the process of the present invention. Upon a substrate 10 are positioned a light source 20 and a lasant material 30. Substrate 10 is generally a thermally neutral material which provides support for the other elements. Furthermore, substrate 10 should have desirable optical characteristics, such as a fairly low index of refraction. Examples of applicable materials for use as substrate 10 are silicon, silicon dioxide and gallium arsenide.

Light source 20 comprises an LED or other similar light source. LED 20 may be a discrete element which is physically attached to substrate 10, or may be an appropriate structure grown or fabricated upon substrate 10. Lasant 30 is positioned adjacent to light source 20 and is also attached to substrate 10. In the preferred embodiment, lasant 30 is produced using the process of ion beam deposition. Attached to, or deposited upon, the two ends 32 and 34 of lasant 30 is a first a reflective coating 40 and a second reflective coating 42.

Lasant 30 is comprised of a host material doped with a rare earth material. Generally, the host material is a single crystalline material having high photon mobility. In one embodiment of the present invention, silicon dioxide is used as the host material which is doped with erbium. It will be understood by those skilled in the art that numerous different materials could be used to make up lasant material 30. For example, the rare earth material used to dope the host material could be erbium (Er), neodymium (Nd) praseodymium (Pr) or ytterbium (Yb). The choice of dopant will largely depend upon the application of the laser and the desired wavelength of the emitted signal.

When lasant 30 is pumped by a light source 20, a population inversion occurs, thus causing the emission of light. This population inversion is characteristic of the rare earth material within lasant 30. The emission of light as the result of this population inversion creates a resonating optical signal within lasant 30. The optical signal is caused to reflect off of both first reflective coating 40 and second reflective coating 42 on either end 32 and 34 of lasant 30. It will be understood by those skilled in the art that lasant 30 could be pumped from either the side as shown in FIG. 1, or from the top or any number of directions.

First reflective coating 40 is totally reflective to the resonating optical signal within lasant material 30. As shown in FIG. 1, the first optical signal is allowed to pass through first reflective surface 40 and into lasant material 30. This accomplishes the necessary pumping of lasant 30 which results in the emission of light.

Second reflective coating 42 is partially reflective and partially transmissive, thus allowing a portion of the resonating optical signal to "escape" from lasant 30. This "escaped," or transmitted, optical signal is then directed toward a waveguide 50. It will be understood by those skilled in the art that the transmitted optical signal could be directed towards any appropriate optical component including waveguides, fiber optic cables, or other electro-optic circuitry.

As previously mentioned, lasant 30 and possibly light source 20 are fabricated using the process of ion beam deposition. This method of thin film deposition is well known in the art.

In summary, ion beam deposition is accomplished by bombarding a target material with a flow of ions, causing particles of the target material to be dislodged from the target and, consequently, deposited upon surrounding surfaces. The advantages of using ion beam deposition include achieving uniformity, stoichiometry, high density, and purity of the thin film which is deposited. Further advantages are the ability to effectively blend differing materials (specifically, the ability to efficiently dope a host material), the ability to deposit materials without using excessive amounts of heat, and the adaptability of ion beam deposition to batch processing of parts. All of these characteristics of ion beam deposition provide the waveguide of the present invention with the quality needed as well as the low cost desired. Furthermore, the quality of thin films deposited by other methods have not displayed the same desirable qualities displayed by thin films deposited using ion beam deposition.

Ion beam deposition is particularly advantageous for the present invention due to the uniformity of the rare earth doping within the host material. Again, in the preferred embodiment, the host material is silicon dioxide and it is doped with erbium. The use of ion beam deposition produces a material having very effective blending of the rare earth material and the host. Furthermore, in the resulting material, the rare earth material is very evenly distributed throughout that layer.

It would be understood by those skilled in the art that other methods of fabricating the lasant material waveguide of the present invention could be used. Other methods include chemical vapor deposition, magnetron sputtering, etc.; however, the characteristics of ion beam sputtering make that process the most desirable.

Figure 2:
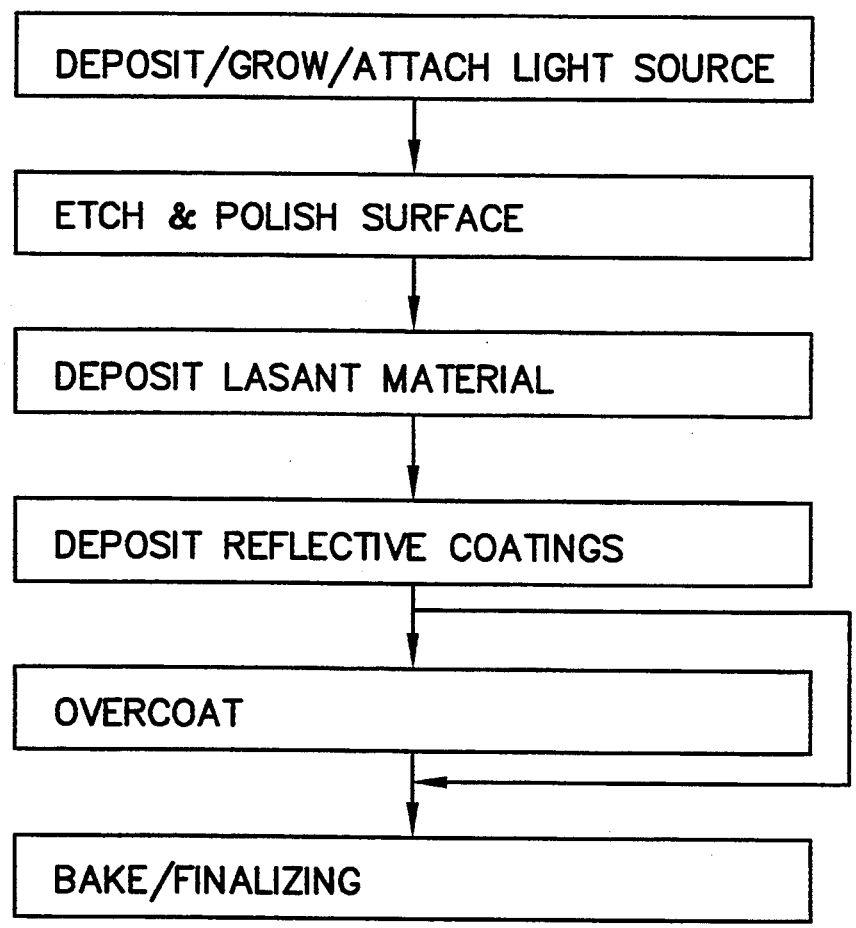
FIG. 2 is a flow chart illustrating the method by which the diode laser is fabricated.

Referring now to FIG. 2, there is shown a flow chart illustrating the process of laser fabrication. While FIG. 2 illustrates a process for fabricating diode lasers in conjunction with the present invention, it will be understood that variations on this process do exist depending on the different materials and components used.

As previously mentioned, the diode laser 100 is configured upon a single substrate 10. Initially, a light source 20 is either grown, deposited, or attached to substrate 10. In the preferred embodiment, a discrete diode is used which must be attached to substrate 10. It is understood that an appropriate structure could be grown or deposited upon the substrate to form the necessary light source.

Next, etching of appropriate regions on substrate 10 is done. This etching creates ridges 46 upon which a lasant material can subsequently be deposited. Referring again to FIG. 1, the ridge or ridges 46 can be seen. To complete this step, the substrate is then polished or prepared for subsequent thin film deposition.

The next step in the process is the actual ion beam deposition of lasant material 30. Lasant material 30 could take on many forms, for example, lasant material 30 could be of a single crystal structure doped with a rare earth material. Alternatively, lasant material 30 could be a more complex structure comprising a plurality of materials configured to accommodate the necessary population inversion. Regardless of the actual configuration of lasant material 30, the process of ion beam deposition is used to fabricate it. Using ion beam deposition provides many advantages including efficiency, cold processing, and quality of deposited film.

Following the creation or deposition of lasant material 30, the necessary reflective coatings are deposited upon ends 32 and 34 of lasant material 30. These reflective coatings, in conjunction with lasant material 30, provide a resonant cavity which will support an oscillating optical signal. Reflective coatings 40 and 42 may take on several forms including a layer of single material or a multilayered structure using a plurality of materials. The actual structure of reflective coatings 40 and 42 must display the appropriate optical properties. That is, reflective coating 40 must be totally reflective while reflective coating 42 must be partially reflective.

Next, an overcoating can be deposited over the lasant material 30. The overcoating must not totally cover the lasant material 30, as it is still necessary to allow the first optical signal to enter lasant 30 and the second optical signal must be allowed to escape. While this overcoating is not necessary, it may be beneficial to help contain optical signals and reduce optical losses in any of the components used.

Lastly, any finishing or finalizing processes may be used at this point. One such process is temp cycling, or "baking" which will help to reduce losses and increase the purity of all materials. The duration and temperature of the temp cycling can vary, but care must be taken to avoid crystallization of the lasant material. Crystallization will increase scatter and loss within the lasant, thus reducing its ability to maintain a resonating optical signal.

As previously mentioned, the process shown in FIG. 2 may be varied to accommodate particular goals or objectives. For example, the light source may not be attached to substrate 10 until after all other materials are deposited upon the substrate.

Figure 3:
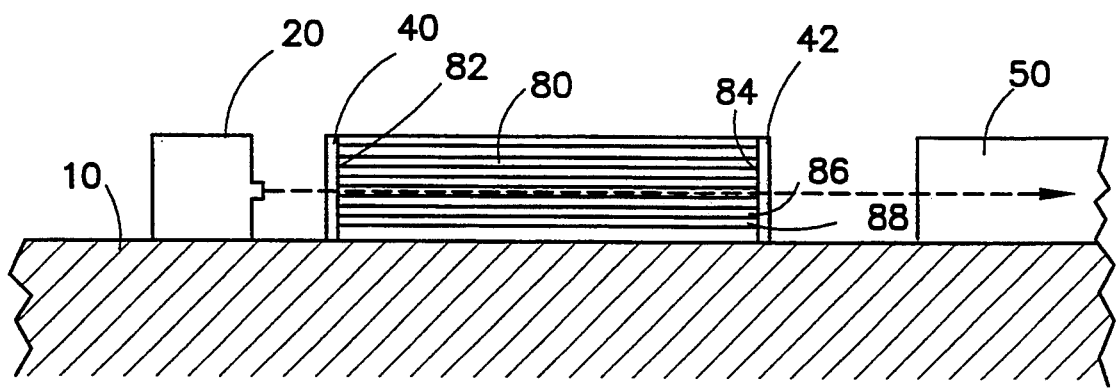
FIG. 3 is a side view showing an alternative embodiment of the present invention.

Referring now to FIG. 3, there is shown an alternative embodiment of the present invention. In this embodiment, the diode laser structure is also placed upon a substrate 10 and comprises a light source 20 and a lasant material 80. Light source 20 provides an optical signal, or pump optical signal, to lasant material 80. The optical signal provided by light source 20 causes a population inversion and, thus, the emission of light within lasant material 80. In this embodiment, lasant material 80 comprises a multilayered structure made up of a plurality of different materials. This type of structure is used to provide wavelength discrimination within the resonant cavity. This discrimination can be used to tune the diode laser so as to produce an optical signal of a very limited frequency band.

In one embodiment, multilayer lasant material is made up of multiple layers 86 and 88 of two materials. The first material will have a low index of refraction, while the second material will have a high index of refraction. The actual materials used and the thickness of the layers can be varied to produce the desired wavelength discrimination.

More specifically, in the preferred embodiment, multilayer lasant material 80 is comprised of a plurality of layers of erbium doped silicon dioxide 86 and zirconium dioxide 88. That is, one layer of material 86 making up the multilayer structure is comprised of a silicon host material doped with erbium while the second layer of material 88 making up the multilayer lasant material 80 is zirconium dioxide. These two layers are then alternately repeated to make up multilayer lasant material 80. The erbium doping within the silicon dioxide layers provides the necessary gain characteristics to allow population inversion and the maintenance of a resonating optical signal. These two materials display one example of the relative indices of refraction of the materials used. Silicon dioxide has an index of refraction near 1.5, while zirconium dioxide has an index of refraction of near 2. Furthermore, the multilayer structure displays very low losses and is, therefore, a very advantageous medium to support this resonating optical signal.

Lastly, the multilayer structure provides birefringence characteristics which allows wavelength discrimination, thus allowing the lasant material to be tuned to support resonating optical signals of a chosen frequency. As previously mentioned, the materials chosen and the thickness of the layers can be altered to achieve frequency discrimination.

It will be understood that many variations in the structure of lasant material 80 could be used. For example, the entire structure could be doped with a rare earth material. Another variation involves the use of indefinite cycles of material, as opposed to specific layers. In this variation there are no definite transitions between the different materials. Conversely, a grated interface exists between the materials wherein the concentration of the materials slowly changes.

As was described in relationship to FIG. 1, the lasant material 80 shown in FIG. 3 also has a first reflective surface 40 and a second reflective surface 42 attached to a first end 82 and a second end 84. Again, second reflective coating 42 is only partially reflective, thus allowing a portion of the resonating optical signal to be transmitted from lasant material 80 onto subsequent devices. Shown in FIG. 3, a waveguide 50 is positioned adjacent to the lasant material 80, thus receiving the transmitted optical signal.

Another method of providing frequency discrimination is through appropriately structuring first reflective coating 40 and second reflective coating 42. These coatings can be structured so as to reflect optical signals of a certain wavelength while also absorbing other optical signals of undesired wavelengths. Thus, by appropriately choosing or structuring first reflective coating 40 and second reflective coating 42, the resonant frequency of lasant material 80 can be adjusted as desired. As an example of how the resonant frequency could be "tuned", the reflective coatings could be made up of multiple layers of dielectric materials. This would take on the form of the well known quarter wavelength mirrors.

Having described the invention in considerable detail, it should be apparent to those skilled in the art that the invention can be modified in arrangement and detail without departing from the principles of the invention.

I claim all modifications coming within the scope and spirit of the following claims:

1. A method for fabricating a diode laser upon a substrate, comprising the steps of:
   (a) attaching a light source to a substrate;
   (b) depositing a lasant material, having a first planar end surface and a second planar end surface which are parallel and opposite one another, upon the substrate and adjacent to the light source in which a first material having a first index of refraction is deposited and a second material having a second index of refraction wherein the second index of refraction is higher than the first index of refraction is deposited, the lasant material deposited using the process of ion beam deposition;
   (c) attaching a reflective surface upon the first end surface of the lasant material for causing any optical signal encountering the reflective surface to be reflected back into the lasant material; and (d) attaching a partially reflective surface to the second end surface of the lasant material, the second end being parallel with and opposite the first end, the partially reflective surface causing a portion of optical signals encountering the partially reflective surface to be reflected back into the lasant material while the remainder of optical signals encountering the partially reflective surface is transmitted therethrough.

2. The method of claim 1 wherein the first material is a host material doped with a rare earth material.

3. The method of claim 2 wherein the host material is silicon dioxide.

4. The method of claim 2 wherein the rare earth material is erbium.

5. The method of claim 1 wherein the second material is zirconium dioxide.

6. The method of claim 1 further comprising the step of transitioning from a first material to a second material so as to create a grated interface between the first material and the second material.

7. The method of claim 6 wherein the first material is a host material doped with a rare earth material.

8. The method of claim 6 wherein the second material is zirconium dioxide.

9. The method of claim 1 further comprising the steps of alternately repeating the deposition of a first material and the deposition of a second material so as to form a multilayer lasant material.

10. A method of fabricating a diode laser upon a substrate, wherein the diode laser will be used to provide an optical signal to a waveguide which is also attached to the substrate, the method comprising the steps of:
   (a) growing a thin film of silicon dioxide upon the surface of the substrate adjacent to the waveguide;
   (b) etching the silicon dioxide layer upon the substrate to form an appropriate pattern of remaining silicon dioxide upon which the diode laser can be formed, the pattern allowing alignment of the diode laser with the waveguide;
   (c) depositing a lasant material upon the remaining layer of silicon dioxide, the lasant material deposited using ion beam deposition and configured to have a first end and a second end which are both positioned perpendicular to the surface of the substrate, the second end also being positioned adjacent to the waveguide;
   (d) attaching a first reflective coating to the first end of the lasant material, the first reflective coating capable of reflecting an optical signal of a predetermined wavelength;
   (e) attaching a second reflective coating to the second end of the lasant material, the second reflective coating being partially reflective and partially transmissive so as to reflect a portion of an optical signal which strikes the surface thereof and to transmit a the remainder of the optical signal which strikes the surface thereof;
   (f) attaching a light source to the substrate and positioning the light source adjacent to the lasant material such that light generated by the light source is directed toward the lasant material; and
   (g) covering the lasant material, the light source and the substrate with a containment layer to contain all optical signals.

11. The method of claim 10 wherein the step of depositing the lasant material comprises a host material doped with a rare earth material.

12. The method of claim 11 wherein the host material is silicon dioxide.

13. The method of claim 11 wherein the rare earth material is erbium.

14. The method of claim 10 wherein the lasant material is a structure consisting of multiple thin films of material stacked upon one another, the step of depositing a lasant material comprising the steps of:
   (a) depositing a first material using ion beam deposition; and
   (b) depositing the second material using ion beam deposition.

15. The method of claim 14 wherein the first material is silicon dioxide doped with erbium.

16. The method of claim 14 wherein the second material is zirconium dioxide.

17. The method of claim 14 further comprising the step of transitioning from a first material to a second material so as to create a grated interface between the first material and the second material.

18. The method of claim 17 wherein the first material is silicon dioxide doped with erbium.

19. The method of claim 17 wherein the second material is zirconium dioxide.

* * * * *